(12) United States Patent
Tang et al.

(10) Patent No.: US 10,698,126 B2
(45) Date of Patent: Jun. 30, 2020

(54) TOMOGRAPHICALLY ENHANCED FULL WAVEFIELD INVERSION

(71) Applicants: Yaxun Tang, Spring, TX (US); Sunwoong Lee, Houston, TX (US); Anatoly I Baumstein, Houston, TX (US); Volkan Akcelik, Spring, TX (US)

(72) Inventors: Yaxun Tang, Spring, TX (US); Sunwoong Lee, Houston, TX (US); Anatoly I Baumstein, Houston, TX (US); Volkan Akcelik, Spring, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 328 days.

(21) Appl. No.: 15/614,954

(22) Filed: Jun. 6, 2017

(65) Prior Publication Data

US 2018/0045839 A1 Feb. 15, 2018

Related U.S. Application Data

(60) Provisional application No. 62/374,239, filed on Aug. 12, 2016.

(51) Int. Cl.
*G06F 17/10* (2006.01)
*G01V 1/28* (2006.01)
(Continued)

(52) U.S. Cl.
CPC .............. *G01V 1/282* (2013.01); *G01V 1/303* (2013.01); *G01V 1/364* (2013.01); *G06F 17/10* (2013.01); *G06F 30/00* (2020.01)

(58) Field of Classification Search
CPC ................................ G01V 1/303; G01V 1/364
(Continued)

(56) References Cited

U.S. PATENT DOCUMENTS 8,694,299 B2 * 4/2014 Krebs .................... G01V 11/00
                                                                 703/10
9,081,115 B2 * 7/2015 Routh ....................... G01V 1/28
(Continued)

OTHER PUBLICATIONS

Gao, F., et al. (2016) "Simultaneous inversion for velocity and attenuation by waveform tomography", *Journal of Applied Geophysics*, vol. 131, pp. 103-108.
(Continued)

*Primary Examiner* — Andre Pierre Louis
(74) *Attorney, Agent, or Firm* — ExxonMobil Upstream Research Company—Law Department

(57) ABSTRACT

A computer-implemented method for updating a physical properties model of a subsurface region in an iterative inversion of seismic data using a gradient of a cost function that compares the seismic data to model-simulated data, said method comprising: obtaining a contrast model of a subsurface physical parameter that is sensitive to data dynamics and a kinematic model of a subsurface physical parameter; determining a gradient of a cost function using the contrast model and the kinematic model, wherein the cost function compares seismic data to model-simulated data; updating the kinematic model using a search direction derived from the gradient; adapting the contrast model according to an update to the kinematic model performed in the updating step; iteratively repeating the determining, updating, and adapting steps until a predetermined stopping criteria is reached, and generating a subsurface image from a finally updated kinematic model; and using the subsurface image to prospect for hydrocarbons.

13 Claims, 2 Drawing Sheets

(51) Int. Cl.
  *G06F 30/00* (2020.01)
  *G01V 1/30* (2006.01)
  *G01V 1/36* (2006.01)

(58) Field of Classification Search
  USPC .......................................................... 703/2
  See application file for complete search history.

(56) References Cited

U.S. PATENT DOCUMENTS

2013/0311149 A1* 11/2013 Tang ................. G06F 17/50
                                                    703/2
2017/0097428 A1* 4/2017 Sun .................. G01V 1/303
2017/0108602 A1* 4/2017 Yang ................. G01V 1/282

OTHER PUBLICATIONS

Tang, Y. et al. (2013), "Tomographically enhanced full wavefield inversion", SEG Technical Program Expanded Abstracts 2013; pp. 1037-1041.
Plessix, R. E., (2006), "A review of the adjoint-state method for computing the gradient of a functional with geophysical applications", *Geophysical Journal International*; vol. 167, pp. 495-503.
Tarantola, A., (1984), "Inversion of seismic reflection data in the acoustic approximation", *Geophysics*; vol. 49, No. 8, pp. 1259-1266.
Wu, R. et al., (1987), "Diffraction tomography and multisource holography applied to seismic imaging", *Geophysics*; vol. 52, No. 1, pp. 11-25.
Xu, S., (2012), "Inversion on reflected seismic wave", *SEG Technical Program Expanded Abstract*; doi: 10.1190/segam2012-1473. 1; pp. 1-7.

* cited by examiner

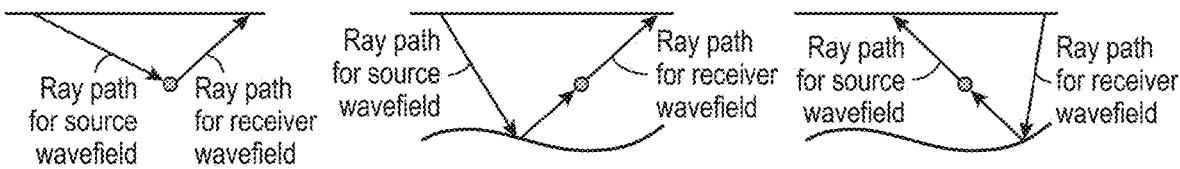
FIG. 1A   FIG. 1B   FIG. 1C
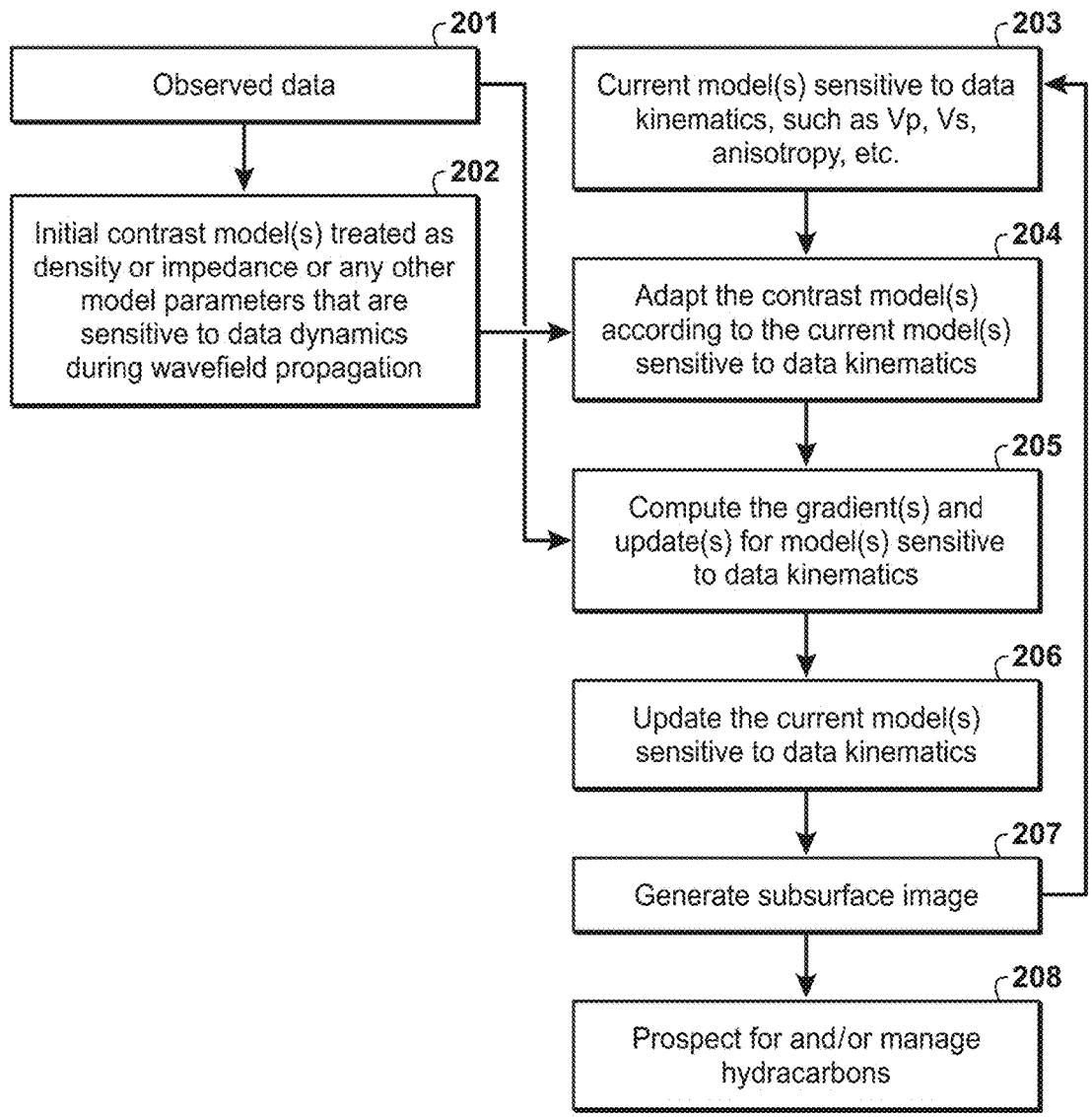
FIG. 2

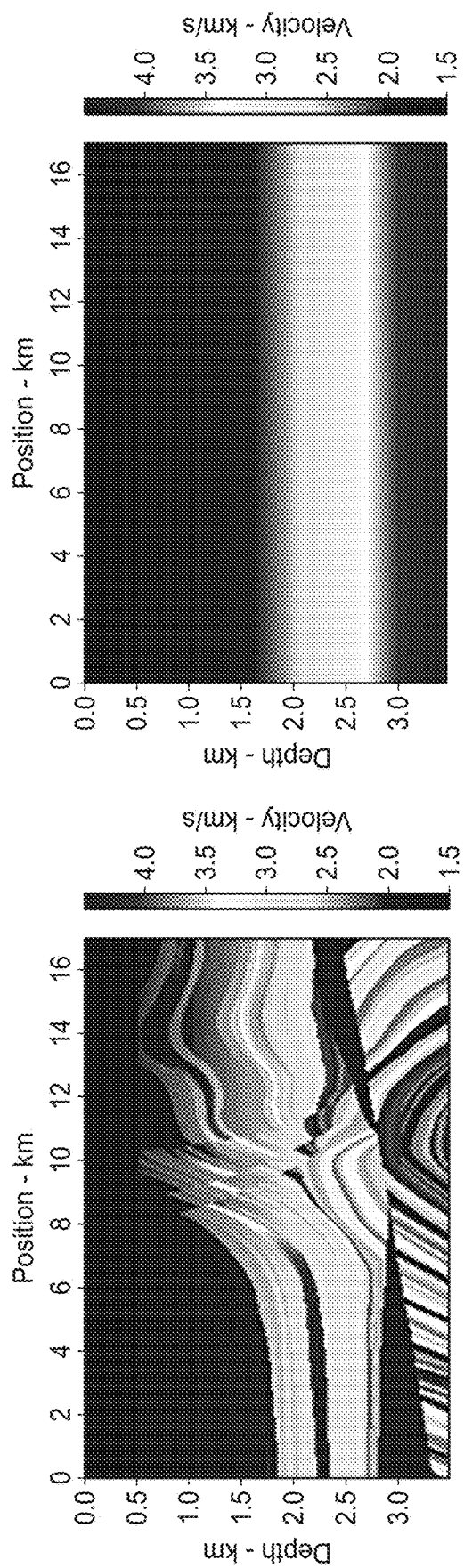
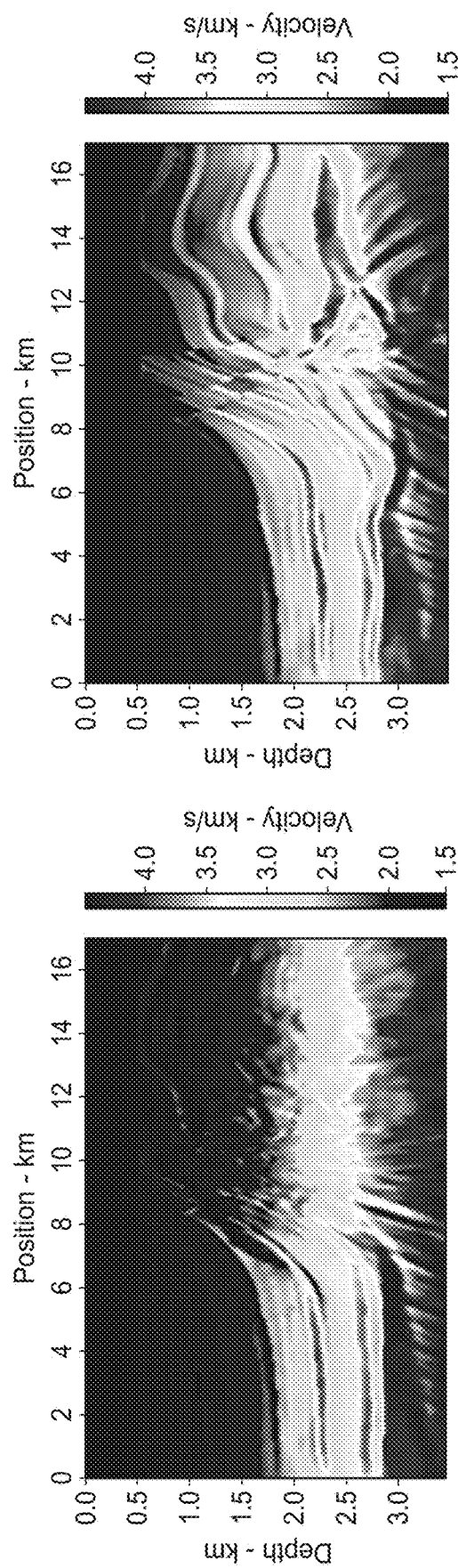
FIG. 3A
FIG. 3B
FIG. 3C
FIG. 3D

TOMOGRAPHICALLY ENHANCED FULL WAVEFIELD INVERSION

CROSS-REFERENCE TO RELATED APPLICATIONS

This application claims the benefit of U.S. Provisional Patent Application 62/374,239 filed Aug. 12, 2016 entitled TOMOGRAPHICALLY ENHANCED FULL WAVEFIELD INVERSION, the entirety of which is incorporated by reference herein.

This application includes subject matter related to U.S. Publication No. 2013/0311149 (application Ser. No. 13/849,270), the entirety of which is incorporated herein by reference.

TECHNOLOGICAL FIELD

This disclosure relates generally to the field of geophysical prospecting and, more particularly, to seismic data processing. Specifically, the disclosure relates to a method for inverting the full wavefield of seismic data to infer a physical properties model of the subsurface.

BACKGROUND

This section is intended to introduce various aspects of the art, which may be associated with exemplary embodiments of the present invention. This discussion is believed to assist in providing a framework to facilitate a better understanding of particular aspects of the present invention. Accordingly, it should be understood that this section should be read in this light, and not necessarily as admissions of prior art.

An important goal of seismic prospecting is to accurately image subsurface structures commonly referred to as reflectors. Seismic prospecting is facilitated by obtaining raw seismic data during performance of a seismic survey. During a seismic survey, seismic energy can be generated at ground or sea level by, for example, a controlled explosion (or other form of source, such as vibrators), and delivered to the earth. Seismic waves are reflected from underground structures and are received by a number of sensors/receivers, such as geophones. The seismic data received by the geophones is processed in an effort to create an accurate mapping of the underground environment. The processed data is then examined with a goal of identifying geological formations that may contain hydrocarbons (e.g., oil and/or natural gas).

Full Wavefield Inversion (FWI) is a seismic method capable of utilizing the full seismic record, including the seismic events that are treated as "noise" by standard inversion algorithms. The goal of FWI is to build a realistic subsurface model by minimizing the misfit between the recorded seismic data and synthetic (or modeled) data obtained via numerical simulation.

FWI is a computer-implemented geophysical method that is used to invert for subsurface properties, such as velocity or acoustic impedance. The crux of any FWI algorithm can be described as follows: using a starting subsurface physical property model, synthetic seismic data are generated, i.e. modeled or simulated, by solving the wave equation using a numerical scheme (e.g., finite-difference, finite-element etc.). The term velocity model or physical property model as used herein refers to an array of numbers, typically a 3-D array, where each number, which may be called a model parameter, is a value of velocity or another physical property in a cell, where a subsurface region has been conceptually divided into discrete cells for computational purposes. The synthetic seismic data are compared with the field seismic data and using the difference between the two, an error or objective function is calculated. Using the objective function, a modified subsurface model is generated which is used to simulate a new set of synthetic seismic data. This new set of synthetic seismic data is compared with the field data to generate a new objective function. This process is repeated until the objective function is satisfactorily minimized and the final subsurface model is generated. A global or local optimization method is used to minimize the objective function and to update the subsurface model.

Current implementation of FWI utilizes a gradient-based local optimization technique to optimize the model parameters. The gradient-based inversion relies on computing the gradient of the mismatch objective functional. The tomographic term, obtained by cross-correlating the forward-scattered wavefields, mainly updates the long wavelength components of the model parameters, whereas the migration term, obtained by cross-correlating the backward-scattered wavefields, mainly updates the short wavelength components of the model parameters. Conventional FWI does not explicitly distinguish contributions of the tomographic and migration terms, and it implicitly combines these two terms with equal weights. This often results in the FWI gradient having a very weak tomographic term. This is especially true when the data lack low frequencies, and the reflectivity contrast of the media is relatively weak. The lack of the tomographic component in the gradient makes the conventional FWI ineffective in updating the background (the long wavelengths) of the model parameters. Therefore, in such situations, the inversion result is often oscillatory, exhibited by cycle skipping between the observed and simulated data. Cycle skipping is known to produce objective functions that have many local minima, which prevent commonly used optimization techniques (e.g., conjugate gradient optimization) from finding the true global minimum.

It has been well accepted that, for reflection dominant data, conventional FWI (Tarantola, 1984) lacks the ability to update long wavelengths of the velocity model and requires a very accurate starting model to converge to a geologically meaningful result. If the conventional FWI starts with a relatively "poor" starting model, where the kinematic differences between the simulated data and the observed data are greater than half of the dominant wavelength, it often gets stuck in local minima because of cycle skipping. One fundamental reason of the failure is that for a typical seismic bandwidth, especially for the fact that low frequency data are lacking, the gradient of the conventional FWI at early iterations usually contains strong high-wavenumber information, but very weak mid- to low-wavenumber information. This high-wavenumber-biased characteristic of the gradient makes FWI update predominantly the short wavelengths, instead of the long wavelengths of the velocity model. This anchors the high wavenumber information (i.e., reflectivities) at the wrong position because of the wrong starting model (think about mis-positioned reflectors in migration due to a wrong migration velocity). The lack of the ability to generate sufficient long wavelength model updates and the freedom to move the mis-positioned high wavenumber information around, makes conventional FWI stuck in local minima.

SUMMARY

A computer-implemented method for updating a physical properties model of a subsurface region in an iterative inversion of seismic data using a gradient of a cost function that compares the seismic data to model-simulated data, the method including: obtaining a contrast model of a subsurface physical parameter that is sensitive to data dynamics and a kinematic model of a subsurface physical parameter; determining a gradient of a cost function using the contrast model and the kinematic model, wherein the cost function compares seismic data to simulated data; updating the kinematic model using a search direction derived from the gradient; adapting the contrast model according to an update to the kinematic model performed in the updating step; iteratively repeating the determining, updating, and adapting steps until a predetermined stopping criteria is reached, and generating a subsurface image from a finally updated kinematic model; and using the subsurface image to prospect for hydrocarbons.

In the method, the obtaining the contrast model can include performing a full wavefield inversion process that inverts only the contrast model.

In the method, the obtaining the contrast model can include deriving the contrast model from one or more of migrated stacks, interpreted horizons, or well logs.

In the method, the gradient of the kinematic model can be augmented based on changes of the contrast model with respect to changes of the kinematic model.

In the method, the adapting includes resetting the contrast model to a default value and then performing a full wavefield inversion process that only inverts the contrast model, wherein the full wavefield inversion process uses the updated kinematic model.

In the method, the adapting can include performing a one-dimensional stretching.

In the method, the one-dimensional stretching can include depth-to-time stretching with the kinematic model followed by time-to-depth stretching with the updated kinematic model.

In the method, the adapting includes performing a zero/near-offset demigration with the kinematic model followed by a remigration with the updated kinematic model.

In the method, the adapting can be performed during a line search, which is included in the updating of the kinematic model while the kinematic model is perturbed to determine a step size for updating the kinematic model.

In the method, the contrast model can be density or impedance and the kinematic model can velocity and/or anisotropy.

In the method, the adapting can include adapting the contrast model according to the updated kinematic model to allow subsurface reflectors in the contrast model to move according to the changes in the updated kinematic model.

In the method, the subsurface reflectors in the contrast model are only allowed to move vertically.

In the method, the subsurface reflectors in the contrast model are allowed to move laterally.

In the method, the prospecting can include causing a well to be drilled that targets a hydrocarbon deposit derived from the subsurface image.

BRIEF DESCRIPTION OF THE DRAWINGS

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims. It should also be understood that the drawings are not necessarily to scale, emphasis instead being placed upon clearly illustrating principles of exemplary embodiments of the present invention. Moreover, certain dimensions may be exaggerated to help visually convey such principles.

FIGS. 1A, 1B, and 1C illustrate how a conventional FWI process determines the gradient.

FIG. 2 illustrates an exemplary method of the present technological advancement.

FIGS. 3A, 3B, 3C, and 3D illustrate the true Marmousi model, an initial model, an inverted model using conventional FWI, and an inverted model using the present technological improvement, respectfully.

DETAILED DESCRIPTION OF EXAMPLE EMBODIMENTS

Exemplary embodiments are described herein. However, to the extent that the following description is specific to a particular embodiment, this is intended to be for exemplary purposes only and simply provides a description of the exemplary embodiments. Accordingly, the invention is not limited to the specific embodiments described below, but rather, it includes all alternatives, modifications, and equivalents falling within the true spirit and scope of the appended claims.

The present technological advancement provides a technical solution to above-noted problem of not being able to generate sufficient updates to long wavelengths of the velocity model. The present technological advancement enables FWI to update mid- to long-wavelength of the velocity model, hence relaxing the starting model requirement. This can be achieved by adding two components to the current FWI workflow: 1) generate and separate out the tomographic component (mid- to long-wavelength information) in the FWI gradient by using a contrast model parameter, which is a model that is mostly sensitive to the dynamics (amplitudes) of the data, such as density or impedance, and has little effect on data travel times; and 2) allow the contrast model parameter to adapt as the mid- to long-wavelengths of the velocity model (or more generally, model parameters that are sensitive to data kinematics, such as Vp, Vs, anisotropy, etc.) are updated. This adaptation is allowed when the velocity is updated and/or during line search when the velocity is perturbed.

U.S. patent application Ser. No. 13/849,270 describes how to separate the FWI gradient into a tomographic term and a migration term, so that the tomographic term can be enhanced to improve the mid- to long-wavelength updates to the model. The present technological advancement pertains to how the tomographic component in the FWI gradient can be generated.

An effect of the present technological advancement is to relax the initial model requirement for FWI so that FWI can still converge to a meaningful result even though the starting model is relatively far away from the true model, and consequently improving the accuracy of the velocity model generated from the improved FWI process. This improved velocity model can be used to explore for, extract, and/or prospect for hydrocarbons. The relaxed initial model requirement may also reduce the turnover time for a typical seismic depth imaging project, which requires building an initial velocity model of high accuracy for FWI by using conventional methods, such as ray-based tomography. These conventional velocity model building methods are typically highly labor intensive and time consuming.

FIG. 1A describes how a gradient in a conventional FWI process is formed, wherein the gradient at the subsurface point denoted by the solid circle is obtained by crosscorrelating the forward-propagated source wavefield with the back-propagated receiver wavefield. Since the source and the receiver wavefields are travelling in opposite directions, the gradient is dominated by the high wavenumber information. For comparison, FIG. 1B and FIG. 1C show gradient computation processes when a contrast model is provided. The contrast model generated reflected wave (FIG. 1B is the reflected wave from the source side and FIG. 1C shows the reflected wave from the receiver side), and the reflected wave travels in a similar direction as the receiver wavefield in FIG. 1B and the source wavefield in FIG. 1C. Because they travel in similar directions, they generate mid-to-long wavelength information in the gradient.

An FWI process embodying the present technological advancement can update mid- to long-wavelengths of the velocity model, hence relaxing the starting model requirement. This can be achieved by adding two components to a conventional FWI workflow: 1) generate and separate out the tomographic component (mid- to long-wavelength information) in the FWI gradient by using a contrast parameter, which is mostly sensitive to the dynamics (amplitudes) of the data, such as density or impedance; and 2) allow the contrast parameter to adapt as the mid- to long-wavelength of the velocity model (or more generally, model parameters that are sensitive to data kinematics, such as Vp, Vs, anisotropy, etc.) are updated. This adaptation is allowed when the velocity is updated and/or during line search when the velocity is perturbed. U.S. patent application Ser. No. 13/849,270 describes how to separate the FWI gradient into a tomographic term and a migration term, so that the tomographic term can be enhanced to improve the mid- to long-wavelength updates to the model. The present technological advancement focuses on how to generate the tomographic component in the FWI gradient.

FIG. 2 illustrates an example of a method embodying the present technological advancement. Step 201 of the tomographically-enhanced FWI (TEFWI) workflow includes obtaining the observed data. The data can be acquired from a seismic acquisition involving the activation of sources and the recording of reflected energy from subsurface geologic features by receivers at or near the Earth's surface or in a marine environment. Step 202 of the proposed workflow includes providing a contrast model (e.g. density or impedance) that is mostly sensitive to the dynamics of the data (i.e. amplitudes). This contrast model can be obtained by performing an FWI process using preferably near offset (or near angle) data to locate the reflectors with an initial contrast model being a constant or a smooth model. Alternatively, the contrast model can also be derived from prior knowledge of the subsurface, for example, from migrated image stacks, interpreted horizons, and/or well logs, etc. Step 203 includes obtaining a current velocity model that is sensitive to data kinematics (travel time), such as Vp, Vs, anisotropy, etc. Step 204 includes adapting the contrast model(s) according to the current model(s) sensitive to data kinematics. In the first iteration, the contrast model can be generated based on the starting model by running either an FWI (inverting contrast model only), or from seismic images or interpretations (again seismic images are obtained based on the starting model). Then, in step 205, the contrast model together with the current velocity model, or more generally, current model(s) that are sensitive to data kinematics, are used to compute the gradient for velocity and/or other kinematic model parameters, and updates to the model(s) sensitive to data kinematics. Obviously, during the computation of the gradient for the kinematic models, the contrast model is treated as density or impedance, if it is obtained through FWI. If, however, the contrast model is derived by other means, e.g., from migrated stacks, interpreted horizons or well logs, a proper phase and amplitude shaping can be applied to make sure that the phase (and amplitude) of the contrast model is consistent with the physical parameter (density or impedance) that is used during wavefield propagation. Of course, other model parameters sensitive to the data dynamics (e.g., shear wave impedance, Vp, and Vs ratio) could also be used for this process.

The significance of the additional contrast model is that the reflectors in the contrast model generate scattered waves that propagate in similar directions as the background source and receiver wavefields. The additional scattered waves are crucial in providing mid-to-long wavelength information in the FWI gradient because wavefields propagating at different angles generate different wavenumber contributions to the FWI gradient. The angle-dependent wavenumber contribution can be described by the following equation (Wu and Toksoz, 1987):

$$|k_z| = \frac{2\omega}{v} \sin\frac{\theta}{2} \quad (1)$$

where $|k_z|$ is the magnitude of the vertical wavenumber, v is the local velocity, which is assumed to be locally constant, $\omega$ is the temporal frequency, and $\theta$ is the angle between source and receiver wavefield propagation directions. So, for a fixed frequency, small wavenumber (corresponding to mid-to-long wavelength) coverage can be obtained when $\theta$ is very small, i.e., when source and receiver wavefields propagation directions are similar to each other. With the inclusion of the contrast model, the scattered waves generated upon the contrast model propagate in similar directions with background source and receiver wavefields, hence mid-to-long wavelength components (a.k.a. tomographic components) are generated in the gradient (see FIG. 1). We can then separate out or reweight the tomographic component from the FWI gradient. One way to achieve the separation is by using methods described in U.S. patent application Ser. No. 13/849,270. Alternatively, we can also separate the tomographic component out with a simple spatial low pass filter, which only keeps mid-to-long wavelength information and removes short-wavelength information of the gradient. The tomographic component of the gradient is then used to update the mid- to long-wavelength of the velocity model in step 206.

In the subsequent iterations, the contrast model is adapted according to the updated velocity model to allow reflectors in the contrast model to move according to the changes in the velocity model. We achieve this by either resetting the contrast model to a constant or a default smooth model and then re-inverting it with an FWI process using the updated velocity model, or using other techniques, such as, depth-to-time stretch with old velocity followed by time-to-depth stretching with an updated velocity to only move the reflectors vertically, or zero/near offset demigration/remigration to allow lateral movements, etc. The present technological advancement can exploit the time/depth ambiguity for zero-offset seismic reflection and move the reflector depth around according to the changes in the velocity. Zero-offset demigration/remigration does not assume ray paths are vertical, and it can deal arbitrary lateral velocity variations, therefore, the reflectors are not limited to move only vertically, they can also move laterally, focus or defocus, depending on how the velocity has been changes. It is more accurate but less computationally efficient than time-depth transform.

The workflow is described in FIG. 2. The process started out by supplying a contrast model obtained from FWI (fixing kinematic models and inverting only the contrast parameter), then the process computed the gradient of the kinematic models and updated the kinematic models. Because the contrast parameter is now dependent on the kinematic model, it can be changed once the kinematic model has been updated. By definition, the contrast model (density, for example) is only sensitive to the amplitudes of the data, so the with inverted contrast model contains only interfaces (similar to a migrated seismic image, where only the discontinuities of subsurface properties will be imaged). The locations of these interfaces depend on the kinematic models (velocities, anisotropy parameters) that we use to generate it. Once the kinematic model is changed, the locations of the interfaces can be moved. Here, "resetting the contrast model to a constant and then re-inverting it" achieves this purpose. Resetting the contrast model to a constant (it might be broader to say a default smooth value) effectively wipes out the imaged interfaces obtained from the previous kinematic model (before updating), and reinverting the contrast model using the updated kinematic model now puts the interfaces back, but at a different location, because the kinematic model has been changed.

Instead of treating the contrast model to be independent from the kinematic model, as does the conventional multi-parameter FWI, the present technological advancement can couple them together. In other words, now the contrast model becomes a function of the kinematic model. This coupling is achieved by adapting the contrast model according to the changes occurred in the velocity model as described above. Because of the tight coupling between the contrast model and the velocity model (or more generally, the kinematic model), the present technological advancement has the option to modify the velocity gradient with an additional term arising from velocity changes due to changes in the contrast model. Mathematically, this process can be described as follows. Without loss of generality, let's assume that the original model m can be expressed as a concatenation of a kinematic model $m_k$ and a contrast model $m_c$ as follows $$m = \begin{pmatrix} m_k \\ m_c \end{pmatrix} \quad (2)$$

The kinematic model $m_k$ can be further comprised of P-wave velocity model, S-wave velocity model, anisotropy model, etc., depending on the type of physics chosen for inversion and the number of parameters to be inverted. The contrast model $m_c$ can also be comprised of one or more models that are mostly sensitive to data dynamics, such as density, or with a different parameterization, P-impedance and/or S-impedance.

FWI can be carried out by directly optimizing m with the aim to minimize a data misfit function $E(m_k, m_c)$. One popular choice of the misfit function is the L2 norm of the difference between the simulated data and the observed data. But the present technological advancement can be applied to any form of misfit function (also referred to as a cost function or an objective function). Performing FWI this way implicitly assumes that the kinematic model $m_k$ is independent from the contrast model $m_c$. The gradient for both models, i.e., $$\frac{\partial E}{\partial m_k} \text{ and } \frac{\partial E}{\partial m_c}$$

are used to update both models. Instead of solving FWI this way, the present technological advancement couples the contrast model and the kinematic model by making the following change of variables $$m_k = \tilde{m}_k \quad (3)$$

$$m_c = S^{-1}(\tilde{m}_k)S(\tilde{m}_k^0)m_c^0 \quad (4)$$

where $\tilde{m}_k$ is still the kinematic model (a different symbol is used to avoid confusion), $\tilde{m}_c^0$ is the initial contrast model obtained from either a separate FWI using the initial kinematic model $\tilde{m}_k^0$, or from migrated stacks using the initial model, or from interpreted horizon and/or well logs, S is a mapping operator, it can be an 1-D depth-to-time stretching operator, or a zero-offset demigration operator, or something more general that maps the contrast model from depth to time using the kinematic model, and $S^{-1}$ is the (pseudo) inverse of the mapping operator. If the depth-to-time stretching operator is used, it is approximately a time-to-depth stretching operator. If the zero-offset demigration operator is used, it is approximately a pseudo inverse of the zero-offset demigration operator, which can be approximately a zero-offset migration operator. Note that the forward mapping applied to the initial contrast model uses the initial kinematic model $\tilde{m}_k^0$, while the inverse mapping uses the current kinematic model $\tilde{m}_k$. Such a variable transform effectively reduces the free parameter for inversion to only the kinematic model $\tilde{m}_k$, because now the contrast model $m_c$ depends on the kinematic model. By using the chain rule, the gradient of the kinematic model becomes:

$$\frac{\partial E}{\partial \tilde{m}_k} = \frac{\partial E}{\partial m_k} + \frac{\partial E}{\partial m_c}\frac{\partial m_c}{\partial \tilde{m}_k} \quad (5)$$

Now the gradient for the kinematic model contains two terms, the first term is the regular FWI gradient of the kinematic model, and the added second term results from changes in the contrast model as a function of kinematic models. The additional term is introduced because we intentionally make the contrast model to be dependent on the kinematic model, therefore, the changes in the contrast model should produce changes to the kinematic model, and that's essentially what the chain rule says. The gradient can be formally derived by using the adjoint-state method (Plessix, 2006).

Xu, et. al (2012) discusses a related method to use reflections to update the long wavelength of the velocity model. The present technological advancement differs fundamentally from what they have discussed in the following aspects. 1) Xu, et al. uses Born modeling (linearized modeling) to compute the simulated data, which are then used to compare against the observed seismic data. The present technological advancement does not require the use of Born modeling and can use nonlinear modeling to simulate the data. Nonlinear modeling generates both single and multiple scatterings, instead of only single scatterings as does Born modeling. Therefore, the present technological advancement can also work with data contaminated by multiples. 2) Xu, et al. uses scale separation to split the model into a background part and a perturbation part, and the perturbation part is obtained by using least-squares migration, a linear inversion process. In contrast, the present technological advancement can split the model based on parameterization and different data sensitivities of the model parameters. Therefore, the present technological advancement does not suffer from the drawback of scale separation, which is unable to model multiples as discussed above and often leads to a background velocity model with low resolution. The present technological advancement can invert the contrast model (e.g. density or impedance) using nonlinear inversion instead of linear migration/inversion. This is similar to conventional FWI, but with fixing the model parameters that are sensitive to data kinematics, and inverting only the contrast model. 3) The present technological advancement allows the contrast model to adapt to the current velocity model (or model parameters sensitive to the data kinematics) by either resetting the contrast model to a constant or a default smooth model at the beginning of each iteration and reinverting it using the updated velocity model, or using other techniques, such as depth-to-time stretch with old velocity followed by time-to-depth stretching with an updated velocity, or zero/near-offset demigration/remigration, etc. 4) The scale separation Xu, et al. uses assumes the background model is independent from the perturbation model, leading to a different gradient formulation for the background model and the perturbation model. The present technological advancement does not make this distinction and can extract the tomographic component of the FWI gradient with techniques described in patent application Ser. No. 13/849,270 or with a spatial filter. The present technological advancement can further couple the kinematic model with the contrast model, and obtain a new gradient formulation (equation 5).

Returning to FIG. 2, at step 207, the final models can be used to generate images of the subsurface that are useable in step 208 to prospect for and/or manage hydrocarbons. Steps 203-206 can be repeated until a predetermine convergence criteria is satisfied or some other stopping criteria is reached. After the iterations are completed, the resulting kinematic model is the finally updated kinematic model. As used herein, hydrocarbon management includes hydrocarbon extraction, hydrocarbon production, hydrocarbon exploration, identifying potential hydrocarbon resources, identifying well locations, determining well injection and/or extraction rates, identifying reservoir connectivity, acquiring, disposing of and/or abandoning hydrocarbon resources, reviewing prior hydrocarbon management decisions, and any other hydrocarbon-related acts or activities. For, example, prospecting can include causing a well to be drilled that targets a hydrocarbon deposit derived from the subsurface image.

The proposed TEFWI workflow has been applied to a synthetic data example. FIG. 3A shows the true Marmousi model and FIG. 3B is the initial model, which is a simple V(z) model. FIG. 3C shows the result obtained by using conventional FWI, and as expected, since the initial model is very far away from the true model, conventional FWI suffers from cycle skipping, and it predominately updates the high wavenumber of the velocity model and is stuck in local minima. FIG. 3D shows the inverted velocity model using the described TEFWI workflow of the present technological advancement. Note that the proposed method generates a significant amount of long wavelength updates to the velocity model and converges to a much closer solution to the true model than conventional FWI.

In all practical applications, the present technological advancement must be used in conjunction with a computer, programmed in accordance with the disclosures herein. Preferably, in order to efficiently perform FWI, the computer is a high performance computer (HPC), known as to those skilled in the art, Such high performance computers typically involve clusters of nodes, each node having multiple CPU's and computer memory that allow parallel computation. The models may be visualized and edited using any interactive visualization programs and associated hardware, such as monitors and projectors. The architecture of system may vary and may be composed of any number of suitable hardware structures capable of executing logical operations and displaying the output according to the present technological advancement. Those of ordinary skill in the art are aware of suitable supercomputers available from Cray or IBM.

The foregoing application is directed to particular embodiments of the present technological advancement for the purpose of illustrating it. It will be apparent, however, to one skilled in the art, that many modifications and variations to the embodiments described herein are possible. All such modifications and variations are intended to be within the scope of the present invention, as defined in the appended claims. Persons skilled in the art will readily recognize that in preferred embodiments of the invention, some or all of the steps in the present inventive method are performed using a computer, i.e. the invention is computer implemented. In such cases, the resulting gradient or updated physical properties model may be downloaded or saved to computer storage.

The following references are incorporated by reference in their entirety:

Plessix, R. E., 2006, A review of the adjoint-state method for computing the gradient of a functional with geophysical applications, Geophysical Journal International;

Tarantola, A., 1984, Inversion of seismic reflection data in the acoustic approximation, Geophysics;

Wu, R. and Toksoz, N., 1987, Diffraction tomography and multisource holography applied to seismic imaging, Geophysics; and Xu, S., 2012, Inversion on reflected seismic wave, SEG extended abstract.

The invention claimed is:

1. A computer-implemented method for updating a physical properties model of a subsurface region in an iterative inversion of seismic data using a gradient of a cost function that compares the seismic data to model-simulated data, said method comprising:

obtaining a contrast model of a subsurface physical parameter that is sensitive to data dynamics;

obtaining a kinematic model of a subsurface physical parameter that is sensitive to data kinematics;

determining the gradient of the cost function using the contrast model and the kinematic model;

updating the kinematic model using a search direction derived from the gradient;

adapting the contrast model according to said updated kinematic model, such that reflectors of the subsurface region represented in the contrast model are moved according to changes in the updated kinematic model, wherein the adapting includes resetting the contrast model to a default value and then performing a full wavefield inversion process that only inverts the contrast model, wherein the full wavefield inversion process uses the updated kinematic model;

iteratively repeating the determining, updating, and adapting steps until a predetermined stopping criteria is reached, and generating a subsurface image from a finally updated kinematic model; and using the subsurface image to prospect for hydrocarbons.

2. The method of claim 1, wherein the obtaining the contrast model includes performing a full wavefield inversion process that inverts only the contrast model.

3. The method of claim 1, wherein the obtaining the contrast model includes deriving the contrast model from one or more of migrated stacks, interpreted horizons, or well logs.

4. The method of claim 1, wherein the gradient of the kinematic model is augmented based on changes of the contrast model with respect to changes of the kinematic model.

5. The method of claim 1, wherein the adapting includes performing a one-dimensional stretching.

6. The method of claim 5, wherein the one-dimensional stretching includes depth-to-time stretching with the kinematic model followed by time-to-depth stretching with the updated kinematic model.

7. The method of claim 1, wherein the adapting includes performing a zero/near-offset demigration with the kinematic model followed by a remigration with the updated kinematic model.

8. The method of claim 1, wherein the adapting is performed during a line search, which is included in the updating of the kinematic model while the kinematic model is perturbed to determine a step size for updating the kinematic model.

9. The method of claim 1, wherein the contrast model is density or impedance and the kinematic model is velocity and/or anisotropy.

10. The method of claim 1, wherein the adapting includes adapting the contrast model according to the updated kinematic model to allow subsurface reflectors in the contrast model to move according to the changes in the updated kinematic model.

11. The method of claim 10, wherein the subsurface reflectors in the contrast model are only allowed to move vertically.

12. The method of claim 10, wherein the subsurface reflectors in the contrast model are allowed to move laterally.

13. The method of claim 1, wherein the prospecting includes causing a well to be drilled that targets a hydrocarbon deposit derived from the subsurface image.

* * * * *